United States Patent [19]

Mahulikar et al.

[11] Patent Number: 5,043,534
[45] Date of Patent: Aug. 27, 1991

[54] METAL ELECTRONIC PACKAGE HAVING IMPROVED RESISTANCE TO ELECTROMAGNETIC INTERFERENCE

[75] Inventors: Deepak Mahulikar, Meriden, Conn.; Jeffrey S. Braden, Milpitas, Calif.; Stephen P. Noe, Stratford, Conn.

[73] Assignee: Olin Corporation, New Haven, Conn.

[21] Appl. No.: 548,322

[22] Filed: Jul. 2, 1990

[51] Int. Cl.⁵ ............................................. H01L 23/02
[52] U.S. Cl. ..................................... 174/52.4; 357/74; 357/84; 174/35 R
[58] Field of Search ................... 174/52.4, 52.3, 52.2, 174/52.1, 50, 35 R; 357/70, 72, 74, 75, 80, 84

[56] References Cited

U.S. PATENT DOCUMENTS

| | | | |
|---|---|---|---|
| 3,469,017 | 9/1969 | Starger | 174/522 |
| 3,614,546 | 10/1971 | Avins | 357/84 |
| 3,747,829 | 7/1973 | Hofmeister | 228/29 |
| 3,801,728 | 4/1974 | Gallo, Jr. et al. | 174/52.4 |
| 3,825,876 | 7/1974 | Damon et al. | 439/70 |
| 4,035,046 | 7/1977 | Kloth | 439/71 |
| 4,390,220 | 6/1983 | Benasutti | 439/71 |
| 4,410,927 | 10/1983 | Butt . | |
| 4,461,924 | 7/1984 | Butt . | |
| 4,480,262 | 10/1984 | Butt . | |
| 4,498,121 | 2/1985 | Breedis et al. . | |
| 4,521,469 | 6/1985 | Butt et al. . | |
| 4,525,422 | 6/1988 | Butt et al. . | |
| 4,582,556 | 4/1986 | Butt et al. . | |
| 4,649,461 | 3/1987 | Matsuta . | |
| 4,658,334 | 4/1987 | McSparran et al. . | |
| 4,685,034 | 8/1987 | Tetsu et al. . | |
| 4,796,083 | 1/1989 | Cherukuri et al. . | |
| 4,800,464 | 1/1989 | Roos et al. . | |
| 4,812,896 | 3/1989 | Rothgery et al. . | |
| 4,827,376 | 5/1989 | Voss . | |
| 4,831,211 | 5/1989 | McPherson et al. . | |
| 4,831,498 | 5/1989 | Baba . | |
| 4,849,857 | 7/1989 | Butt et al. . | |
| 4,866,571 | 9/1989 | Butt . | |
| 4,888,449 | 12/1989 | Crane et al. . | |
| 4,897,508 | 1/1990 | Mahulikar et al. . | |

OTHER PUBLICATIONS

Matisoff, "Handbook of Electronics Packaging Design and Engineering", at Chapter 11, entitled, 'Radio Frequency and Electromagnetic Shielding' (pp. 233–257), Van Nostrand Reinhold Company, 1982.

Shrivastava, entitled, "Inductance Calculation and Optimal Pin Assignment for the Design of Pin-Grid Array and Chip Carrier Packages", appearing in IEEE Transactions on Components, Hybrids & Manufacturing Technology, vol. 13, No. 1, Mar. 1990, pp. 147–153.

Primary Examiner—Leo P. Picard
Assistant Examiner—Bot Lee Ledynh
Attorney, Agent, or Firm—Gregory S. Rosenblatt; Paul Weinstein

[57] ABSTRACT

A metal electronic package is provided having improved electromagnetic interference shielding. Metal base and cover components are electrically interconnected to remain at same voltage potential thereby reducing EMI induced mutual inductance. An electrically conductive conduit, such as a contact pin, provides interconnection. If the electronic device is mounted on a chip pad attach, the conductive conduit also connects to the support pads of the chip attach.

38 Claims, 4 Drawing Sheets

METAL ELECTRONIC PACKAGE HAVING IMPROVED RESISTANCE TO ELECTROMAGNETIC INTERFERENCE

The present invention relates to metal packages for housing electronic devices. More particularly, the invention relates to methods to electrically interconnect the base and cover components to reduce electromagnetic interference (EMI).

BACKGROUND OF THE INVENTION

Microelectronic devices are typically manufactured from a semiconductor material, such as silicon, germanium or gallium/arsenide. The semiconductor material is fashioned into a die, a generally rectangular structure having circuitry on one surface. Along the periphery of the surface are input/output pads for electrical interconnection to external components. The device is brittle and requires protection from moisture and mechanical shock. This protection is provided by a package which encapsulates the device. The package further contains an electrically conductive means, such as a leadframe, to transport signals between the device and external circuitry.

Package components are made from ceramics, plastics and metals. Ceramic packages are characterized by excellent reliability. Ceramics are brittle, expensive and poor conductors of heat. During operation, the device generates heat. If not removed, the device will overheat reducing operating life.

Plastic packages are not brittle and are relatively inexpensive to manufacture. The thermal performance of a plastic package may be improved by molding a metal heat spreader into the the body of the package. Plastic packages are susceptible to moisture permeation which may lead to corrosion damage to the device circuitry and to the bond wires.

Metal packages have better thermal conductivity and lower cost compared to ceramic packages. Metal packages have better hermeticity and reliability than plastic packages. For these reasons, metal packages are preferred for housing high power semiconductor devices which generate significant quantities of heat during operation.

A typical metal package is disclosed in U.S. Pat. No. 4,796,083 to Cherukuri et al. The package has metal or metal alloy base and cover components. Disposed between the base and the cover is a leadframe. A sealing glass bonds the leadframe to both. Alternatively, the sealing glass may be replaced with a polymer adhesive as disclosed in U.S. Pat. No. 4,888,449 to Crane et al. Both glass and adhesively sealed metal electronic packages frequently employ a centrally positioned die attach pad. The semiconductor device is bonded to the pad. The pad is then bonded to the package base with either a conductive means such as a solder or a dielectric means such as a sealing glass or adhesive.

The metal package may then have up to four parallel conductive planes separated by dielectric layers, the base, cover, leadframe and die attach pad. When a magnetic field passes through the structure, mutual inductance may result. Inductance is the generation of an electromotive force in one circuit by a change of current in an adjoining circuit. Each conductive plane of the metal package behaves as a circuit. A current induced in one component will influence the performance of the other components.

The magnetic field is frequently in the form of electromagnetic interference. EMI may originate external to the package in the form of radio waves, static electricity or other generated magnetic fields. The interference may also be internally generated by voltage changes in the device during operation. EMI can result in voltage potential deviations across the electronic device leading to soft errors and device malfunction. When mutual inductances between the leadframe and the other components becomes large, logic transition times are increased significantly by the time constants associated with the inductances. Both switching speed and noise characteristics are affected.

The internally produced EMI is capable of generating interference with external electronic devices and also must be shielded.

A second advantage of the invention is that the grounded base and cover are parallel planes separated from the leadframe by a low dielectric polymer adhesive, i.e. the epoxy seal. The base and cover form a ground plane. The ground plane reduces mutual capacitance between adjacent leads of the leadframe. This reduces the coupling of radiated EMI from one lead to another.

To maximize the performance of a metal package, it is desirable to shield the components and encased device from electromagnetic interference. Shielding of the semiconductor device has been accomplished by grounding the device to the base of the package. The use of a conductive die attach material such as a solder grounds the device. Extending a bond wire from an input/output pad on the face of the device to the package base is also used.

While suitable for grounding the electronic device to the package base, the leadframe and cover components are still free floating conductive planes and mutual inductances and the associated problems are still present. Extending a bond wire from the device to the package base requires additional processing steps and coating the base with a material suitable for wire bonding. Likewise, soldering requires coating the base with a material which is wet by the solder.

SUMMARY OF THE INVENTION

The present invention provides a metal electronic package which is not subject to the problems of mutual inductances. Further, the package of the invention does not require additional processing steps or coating the base surface with a special coating. Beneficially, the solution to the inductance problem produces a metal package with improved assembly properties.

Accordingly, it is an object of the invention to provide an adhesively sealed electronic package with improved EMI shielding. It is a feature of the invention that the package base, cover, electronic device and die attach pad (if used) are at the same voltage potential. It is a further feature of the invention that the device may be grounded directly to the package base or bonded to the centrally positioned die attach pad. It is an advantage of the invention that the metal electronic package has reduced mutual capacitance and lead cross talk.

In one embodiment of the invention, protrusions extending from the base and cover component serve as a portion of the grounding means. It is an advantage of the invention that the protrusions accurately position an epoxy preform. The protrusions are also a stop off ensuring each assembled package has the same overall thickness. As a further advantage, the stop offs prevent the base and cover from contacting the leads. A more simplified and readily automated process results. Still another advantage of the protrusions is that they may be used for electrical contact points during anodization or plating of the base and cover components.

In accordance with the invention, there is provided a package adapted to receive an electronic device. The package has metal or metal alloy base and cover components with a leadframe disposed between. A dielectric sealant bonds the leadframe to both the base and cover components. A means for electrically interconnecting the base and cover components maintains both at the same voltage potential.

The objects, features and advantages discussed above will become more apparent from the specification and drawings which follow.

IN THE DRAWINGS

DESCRIPTION OF THE PREFERRED EMBODIMENTS

Figure 1:
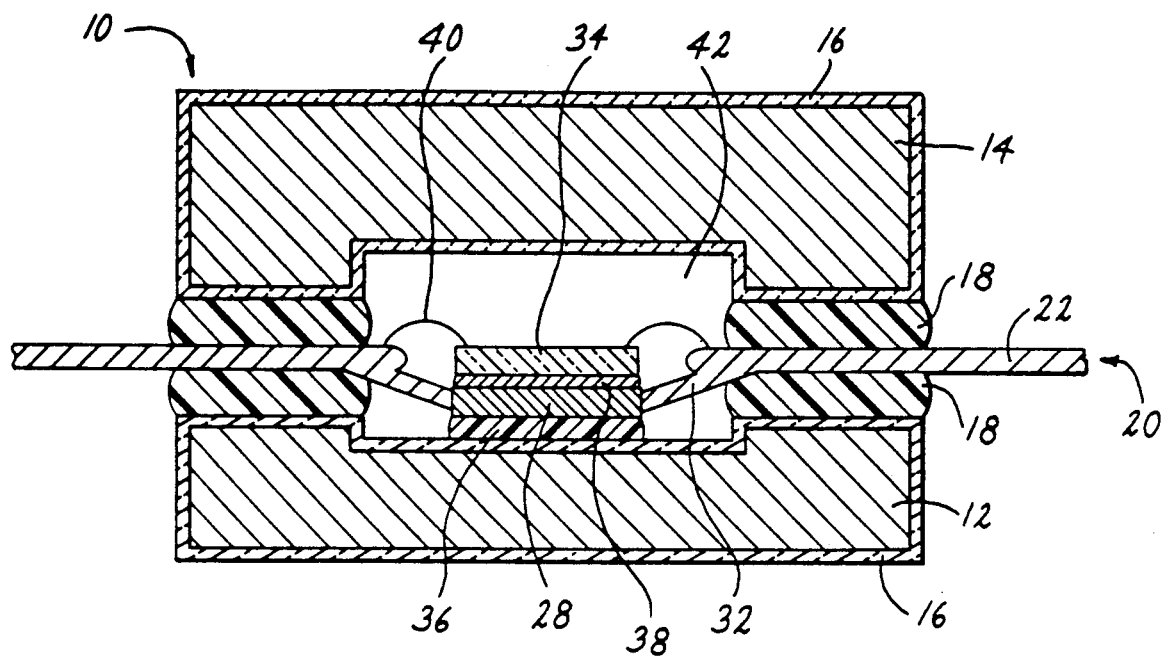
FIG. 1 shows in cross-sectional representation a metal electronic package as known in the art.

FIG. 1 shows in cross-sectional representation, a metal electronic package 10 as known in the art. The package is adapted to receive an electronic device 34 by the inclusion of an enclosed cavity 42 to house the device. The package 10 includes a metal or metal alloy base component 12 and a metal or metal alloy cover component 14. Any suitable metal or metal alloy may be used. One advantage of metal packages is high thermal conductivity so metals and alloys with high thermal conductivity are preferred. Most preferred are copper, aluminum and their alloys.

The base 12 and cover 14 components may be coated with an adhesion enhancing layer 16. The adhesion enhancing layer 16 may be formed in situ, that is, internally by heating and selective oxidation. Alternatively, a second metal or metal alloy capable of forming an adhesion promoting layer 16 is deposited on the surfaces of the base 12 and cover 14 components such as by cladding or electroplating. The adhesion enhancing layer 16 is deposited, at a minimum, on those surfaces which contact dielectric sealant 18.

In a most preferred embodiment, the base 12 and cover 14 components are formed from an aluminum alloy such as aluminum alloy 3003 (nominal composition 0.05-0.2 wt. % copper, 1-1.5% manganese and the balance aluminum). The adhesion promoting layer 16 is an anodization layer. The anodization layer covers those surfaces of the base 12 and cover 14 which contact the sealant 18 or are exposed to the external environment. It is within the scope of the invention for all surfaces of the base 12 and cover 14 components to be coated.

Disposed between the base 12 and cover 14 is a leadframe 20. The leadframe is formed from an electrically conductive material such as copper, a copper alloy or an iron/nickel alloy. It is desirable for the leadframe to have a coefficient of thermal expansion close to that of the base and cover. A preferred leadframe 20 is formed from copper or for improved strength and thermal softening resistance a copper alloy.

Figure 2:
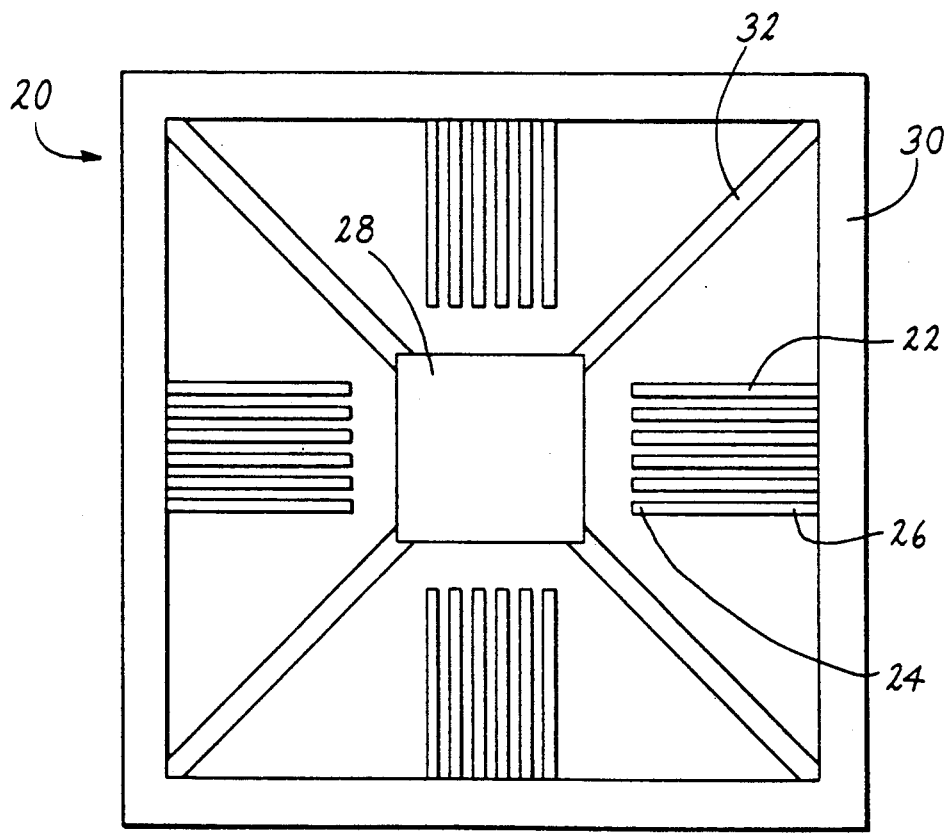
FIG. 2 shows in top planar view a quad leadframe containing a centrally positioned chip attach pad as known in the art.

FIG. 2 illustrates in top planar view a quad leadframe 20 as known in the art. The leadframe 20 has a plurality of leads 22 containing inner 24 and outer 26 lead ends. The inner lead ends 24 are disposed about a centrally positioned chip attach pad 28. Tie bar 30 supports the leads 22 by outer lead ends 26 and the centrally positioned chip attach pad 28 by pad supports 32. Following package assembly, the tie bar 30 is severed to electrically isolate the leads.

The positioning of the leadframe 20 in a package is shown with reference back to FIG. 1. The leads 22 are disposed between the base 12 and cover 14. The leads are electrically isolated from the metallic components by the dielectric sealant 18. Pad supports 32 are downset and position the chip attach pad 28 which supports electronic device 34. An adhesive 36 bonds the chip attach pad 28 to base component 12. Preferably, the adhesive layer 36 has high thermal conductivity. Thermal conductivity may be enhanced by filling the adhesive with a conductive material such as silver powder.

An electrically nonconductive sealant 18 bonds the leadframe 20 to both the base 12 and cover 14 components. The sealant has high resistivity to maintain electrical isolation between the components. One suitable sealant is a sealing glass such as a lead borate or lead borosilicate glass. A particulate additive such as calcium fluoride is added to the glass to raise the coefficient of thermal expansion to match that of the base and cover. Also preferred are polymer adhesives such as a thermosetting epoxy.

During sealing, the glass or polymer is heated to a temperature sufficient to result in adhesive flow. The flow must be controlled to maintain proper spacing between components. Previously flow control was by rigid control of sealing temperatures and the placement of weights on the packages during sealing. As will be detailed below, in preferred embodiments of the invention the means for shielding the semiconductor device from EMI further provides accurate positioning of the adhesive and insures the desired component spacing is maintained.

A die attach 38 bonds the semiconductor device 34 to chip attach pad 28. The die attach may be an adhesive or a solder. If the electronic 34 is to be at the same voltage potential as the package components, the die attach 38 will be electrically conductive. Electrically conductive die attach include silver filled epoxies and low melting solders such as tin/lead alloys.

FIG. 1 illustrates the device 34 bonded to a chip attach pad 28. The pad 28 is not required for all package configurations. The device 34 may also be bonded directly to base component 12.

Bond wires 40 electrically interconnect input/output pads located on the electrically active face of the electronic device 34 to the leads 22. Rather than bond wires, a tape such as used in tape automated bonding may be employed. With TAB, the inner lead ends 24 extend in cantilever fashion into cavity 42 and are bonded directly to the device 34.

Electrical equipment and electronic components generate electromagnetic waves during operation. EMI generated either internally or external to the package leads to mutual inductance within the metallic package components. The inductance decreases the operating speed and may lead to device error. The inventors have developed means to ensure metallic components are at the same voltage potential. By electrically interconnecting all components, mutual inductance is greatly reduced.

Figure 3:
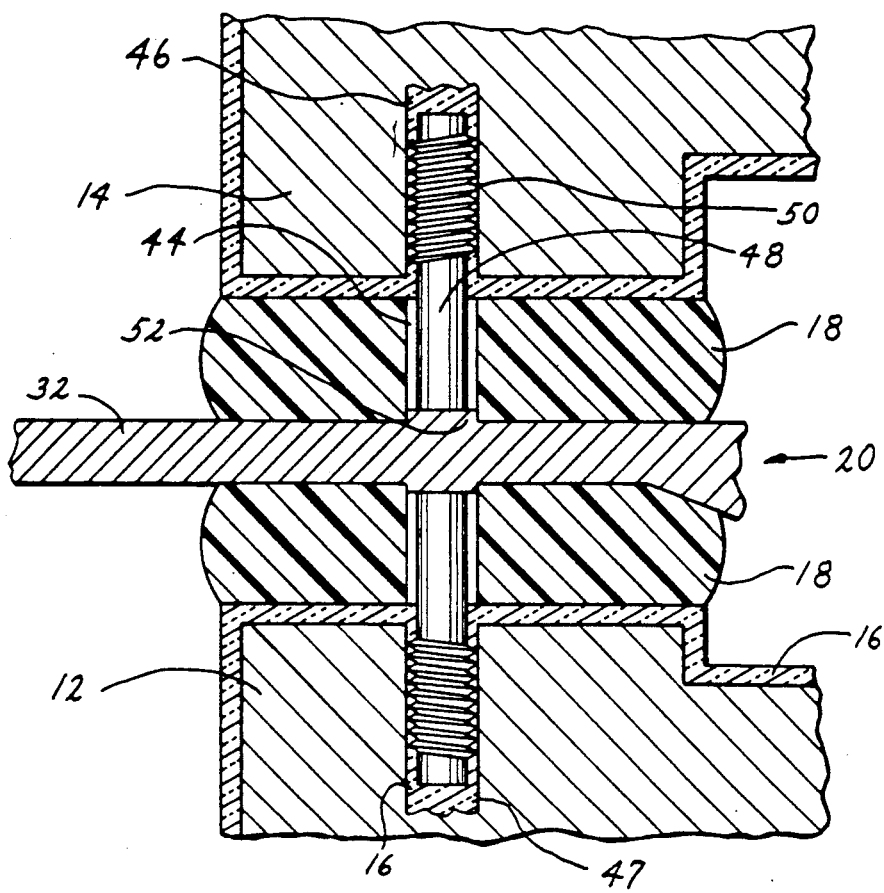
FIG. 3 shows in cross-sectional representation a metal electronic package including grounding pins in accordance with a first embodiment of the invention.

FIG. 3 shows in cross-sectional representation a corner of a package 10. An aperture 44 extends through dielectric sealant 18 and at least part way through the base 12 and cover 14 components to terminate at blind holes 46, 47. The blind holes are in pairs positioned to be in alignment after package assembly. A contact pin 48 is press fed into each blind hole. The contact pins are in matching pairs. Each pin extends inwardly from a blind hole. The length of each contact pin is that sufficient to interconnect each pair. Interconnection may take the form of direct pin to pin connection or, as shown in FIG. 3. both contact pins may be in electrical contact with a pad support 32.

If the blind holes were formed prior to deposition of the adhesion promoting layer 16, the layer may be deposited within. The layer 16 usually contains an oxide and is a poor conductor of electricity. Preferably contact pins 48 contain serrations 50 along the head portion which is inserted into the blind hole. The diameter of the serrated portion is slightly larger than the diameter of the blind hole 46, 47. During press fitting, the serrations break up the oxides or anodization film ensuring good electrical conductivity.

To maximize electrical conductivity, the contact pins 48 are manufactured from copper, aluminum or their alloys. To prevent galvanically induced corrosion, the pins should be formed from the same base metal as the base and cover. Different alloys of the same metal are acceptable. The contact pins 48 may be coated with a second metal such as nickel for copper based pins and anodization for aluminum beased pins to minimize corrosion and enhance adhesion.

In the preferred embodiment with aluminum alloy base and cover components, the components have a coefficient of thermal expansion of about $230 \times 10^{-7}$ in/in/°C. This value is significantly higher than the coefficient of thermal expansion of a copper leadframe 20. Contact pins 48 may make electrical contact with the leadframe 20 by mere physical contact. It is preferred to use an adhesively enhanced electrical bond. A conductive adhesive 52 such as Ablestik 84-1 (Ablestik Labs Gardenia, CA) bonds the ends of the contact pins 48 to pad attach 32. If the package does not include a centrally positioned chip attach pad, the contact pins are bonded to each other The adhesive 52 is selected to have a cure cycle similar to that of the dielectric adhesive 18. Both adhesive layers may be bonded during the same cure cycle.

Figure 4:
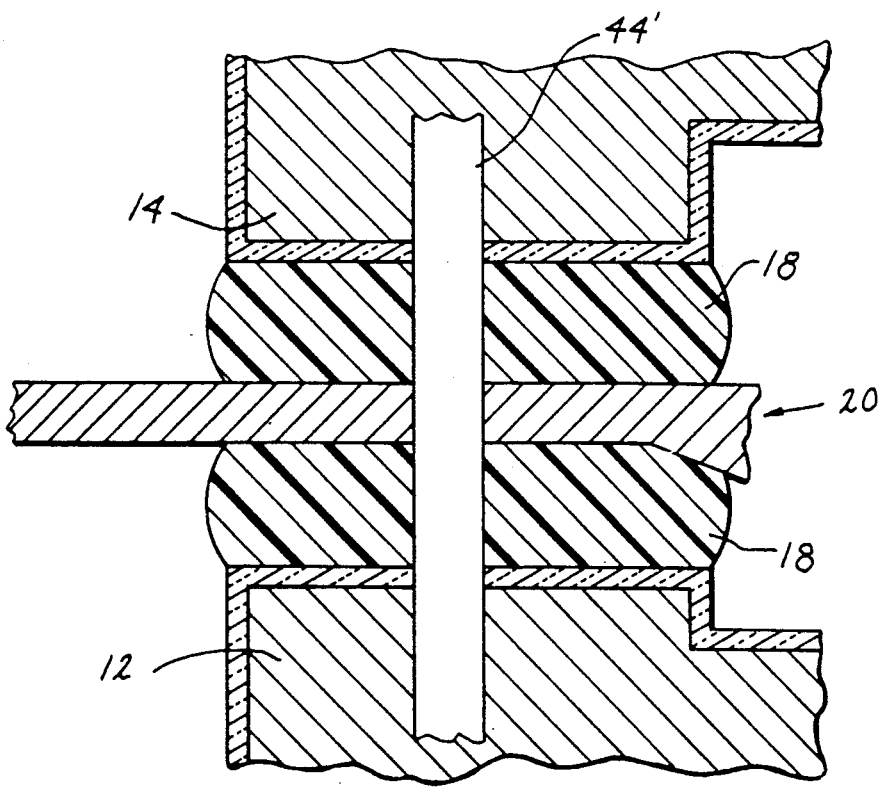
FIG. 4 shows in cross-sectional representation a conductive passageway extending through a package base and cover in accordance with a second embodiment of the invention.

As shown in FIG. 4, the aperture 44' may extend through the base 12 and cover components 14. Contact pins as illustrated in FIG. 3 may be used with through aperture 44'. Subsequent to package assembly, an epoxy plug seals the exterior ends of the aperture. Any suitable material which will adhere to the package components such as a low melting point solder, polymer adhesive or soldering glass may form the plug.

If the through aperture 44' is uncoated with the adhesion enhancing layer, it may then be filled with a conductive material such as a silver filled epoxy. The silver filled epoxy has a cure cycle temperature sufficiently low so the bond integrity adhesive 18 is not reduced. Since the through aperture 44' is sealed at both exterior ends with a plug, an adhesive material is not required to fill the aperture. Any conductive medium such as silver filled solder glasses or low melting solders may be employed.

Figure 5:
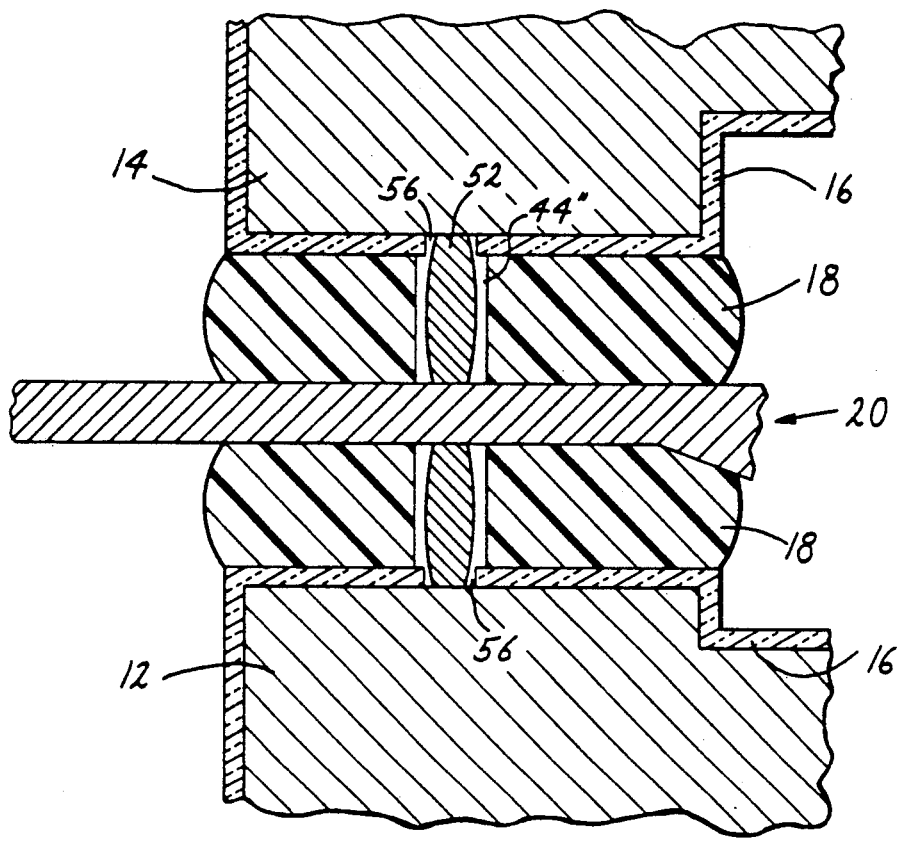
FIG. 5 shows in cross-sectional representation conductive beads electrically interconnecting package components in accordance with a third embodiment of the invention.

As shown in FIG. 5, the aperture 44" may extend only through the dielectric sealant 18. A conductive epoxy 52 such as Ablestik 84-1 bonds the leadframe 20 to the base 12 and cover components 14. To maximize electrical conductivity, the portions 56 of the components which contact the conductive adhesive 52 are free of the adhesion enhancing layer 16. The dielectric sealant 18 provides sufficient bond strength. The reduction in bond strength due to the removal of the adhesion promoting layer at portions 56 does not reduce the reliability of the package.

Figure 6:
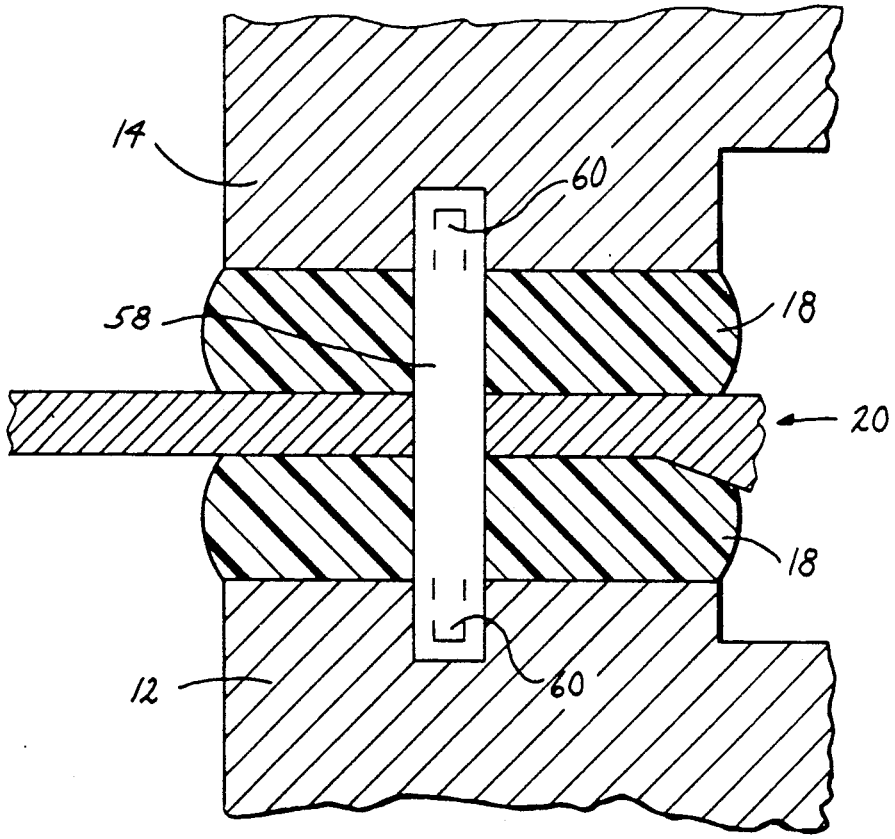
FIG. 6 shows in side planar view a grounding strap in accordance with a forth embodiment of the invention.

FIG. 6 shows yet another means of ensuring the base component 12, cover component 14 and leadframe 20 are at the same voltage potential. A grounding strap 58 is in electrical contact with the components. Bonding is by an electrically conductive adhesive or a low melting temperature solder. The grounding strap 58 is made from an electrically conductive material such as copper or a copper alloy. The grounding strap may be coated with a second metal to minimize oxidation and corrosion. For optimal electrical conductivity, a portion 60 of the base and cover components is free of the adhesion promoting layer. The grounding strap 58 is bonded to the components at the portion 60.

Figure 7:
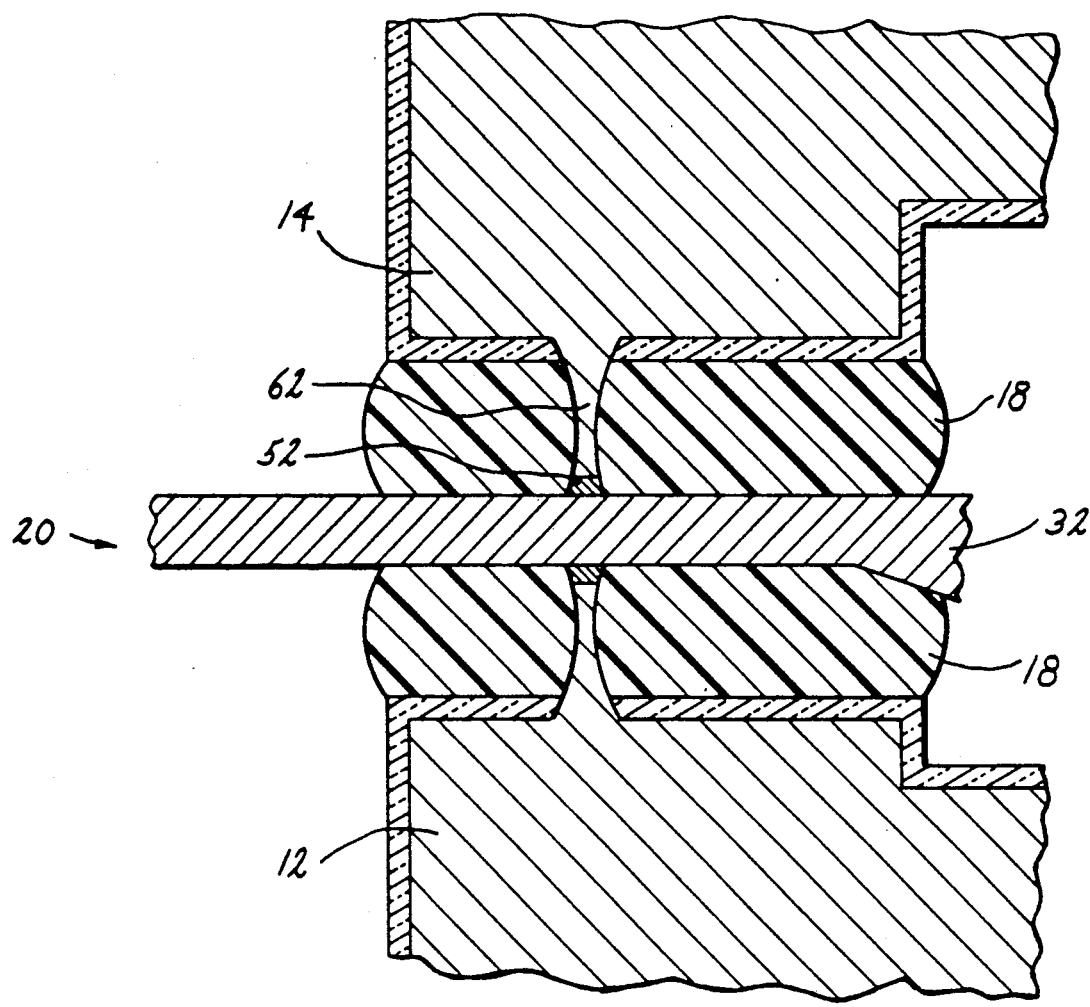
FIG. 7 shows in cross-sectional representation protrusions extending from base and cover components in accordance with a fifth embodiment of the invention.

FIG. 7 shows another means for making electrical contact between the base 12, cover 14, and leadframe 20. Matched pairs of protrusions 62 are formed in and extend inwardly from the base and cover components. The protrusions have a length about equal to the thickness of the sealant 18 following package sealing. The length is on the order of from about 0.005 inches to about 0.020 inches. The protrusions may be formed during the stamping of the base and cover components or as a separate step. A slight dimple may appear on the base and cover components opposite the protrusion. However, the flatness and functionality of the package is not affected. The protrusions 62 are free of the adhesion promoting material to improve electrical conductivity. An electrically conductive adhesive 52 preferably bonds the protrusion 62 to tie bars 32.

Figure 8:
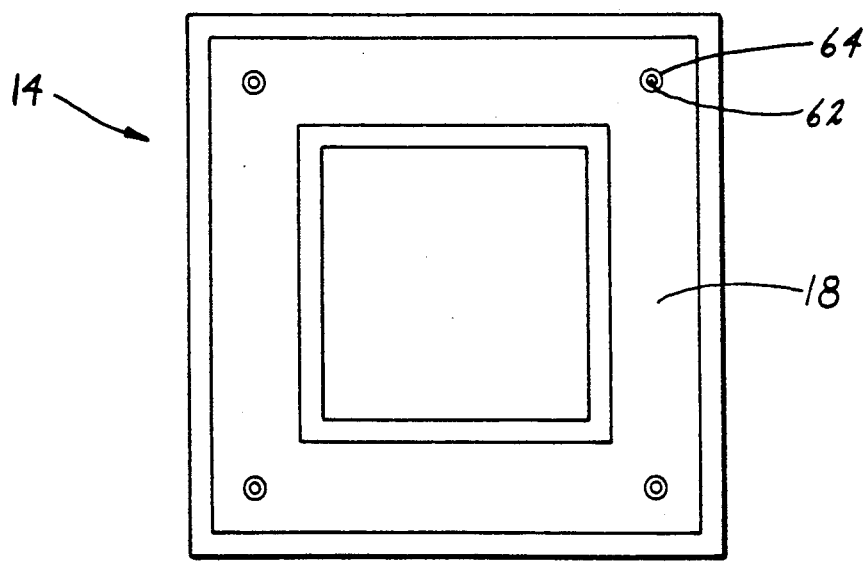
FIG. 8 shows in bottom planar view alignment of an adhesive preform on the protrusions of the invention.

The protrusion 62 and contact pins are preferred embodiments of the invention. Besides providing electrical interconnection between components to eliminate mutual inductance, they facilitate package assembly. FIG. 8 shows in bottom planar view a lid component 14 containing protrusions 62 in each corner. A dielectric sealant 18 in the form of an epoxy film having a thickness of about 0.01 inches to about 0.015 inches is placed in contact with the lid component 14. Apertures 64 are formed in the corners of the adhesive film. The apertures 64 have a diameter larger than the the diameter of the protrusions 62 and are positioned such that when the epoxy preform is properly aligned, the apertures 64 circumscribe the protrusions. The protrusions align the film and hold it in place during assembly. For alignment purposes, at least two contact pins or protrusions located in diagonally opposed corners of the cover component 14 are required. A matching set of contact pins or protrusions are provided in the base component. Preferably, as illustrated in FIG. 8, a protusion is located at each corner of both the base and the cover.

The protrusions are also useful as contact points during anodization or other electrochemical processes such as plating. During anodization, the part is immersed in a suitable electrolyte such as 0.05 to 1.0 weight percent sulfuric acid. The component is made cathodic. A negative voltage potential is impressed on the part. Current is supplied by a power source having a wire extending to a clip. The clip is fastened to one or more protrusions 62. The clip is preferably cylindrical in shape and slips over the protrusion 62 so no anodization occurs at the protrusion. Protrusions not shielded by a clip are coated with a suitable resist such as plastic tape to prevent anodization.

Following anodization and alignment of the adhesive layers 18, the assembly is heated to a temperature sufficient to cause the dielectric sealant 18 to flow and bond. To enhance flow, the part is generally subjected to pressure by a weight or clamp. Excessive flow is detrimental. Sealing temperature, weight and adhesive formulation all affect the flow characteristics of the adhesive during the cure cycle. Advantageously, the protusions act as a stop off. All assembled packages have the same overall thickness. Further, the protrusions 62 are effective to ensure the base and cover components do not sink too deeply into the epoxy or sealing glass electrically shorting the leads. The protrusions also compensate for variations in epoxy thickness. Overall package thickness is determined by the height of the matched pair of protrusions rather than epoxy thickness.

While the embodiments of the invention illustrated are in combination with a pad support 32, the pad support 32 is optional. All embodiments may be used to maintain the base 12 and cover 14 at the same voltage potential. Rather than mount the semiconductor device on a centrally positioned pad attach, the device is mounted directly on base component 12.

The patents described hereinabove are intended to be incorporated by reference.

It is apparent that there has been provided in accordance with this invention, a metal electronic package in which the base, cover and electronic device are maintained at the same voltage potential eliminating mutual inductance which fully satisfies the objects, means and advantages set forth herein before. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A package adapted to receive an electronic device, comprising:
    a base component formed from a metal or metal alloy;
    a cover component formed from a metal or metal alloy;
    a leadframe disposed between said base component and cover component;
    dielectric sealant means bonding said base component to said cover component; and
    means for electrically interconnecting said base component and said cover component.

2. The package of claim 1 wherein said base component and said cover component both have an adhesion enhancing layer on at least those portions which contact said dielectric sealant means.

3. The package of claim 2 wherein said leadframe further includes a centrally positioned chip attach pad and pad supports.

4. The package of claim 2 wherein said means for electrical interconnection comprises matched pairs of contact pins extending inwardly from said portions of said base component and said cover component through said dielectric sealant means, each of said contact pins terminating at a tip which is electrically interconnected to the tip of said matched contact pin.

5. The package of claim 4 wherein each said tip is coated with an electrically conductive adhesive.

6. The package of claim 5 wherein each said contact pin extends into an aperture formed in said base component or said cover component, said aperture extending from said dielectric sealant means at least part way through said base component or said cover component thereby either forming a through hole or terminating at an exterior end within said base component or said cover component.

7. The package of claim 6 wherein each said contact pin has a serrated head with a diameter larger than the diameter of said aperture.

8. The package of claim 7 wherein said contact pin is formed from the same base metal as said base component and said cover component.

9. The package of claim 7 wherein said aperture extends through said base component or said cover component, the exterior end of said aperture being sealed with a plug.

10. The package of claim 9 wherein said plug is selected from the group consisting of low melting temperature solders, polymer adhesives and sealing glasses.

11. The package of claim 5 wherein said contact pins comprise matched pairs of protrusions extending from said base component and said cover component.

12. The package of claim 3 wherein said means for electrical interconnection comprises contact pins making electrical contact with said pad supports.

13. The package of claim 12 wherein the tip of each said contact pin is coated with an electrically conductive adhesive.

14. The package of claim 13 wherein each said contact pin extends into an aperture formed in said base component or said cover component, said aperture extending at least part way through said component thereby forming either a through hole or terminating at an exterior end within said base component or said cover component.

15. The package of claim 14 wherein each said contact pin has a serrated head with a diameter larger than the diameter of said aperture.

16. The package of claim 15 wherein said aperture extends through said base component or said cover component, the exterior end of said aperture being sealed with a plug.

17. The package of claim 16 wherein said plug is selected from the group consisting of low melting temperature solders, polymer adhesives and sealing glasses.

18. The package of claim 13 wherein said contact pins comprise matched pairs of protrusions extending from said base component and said cover component.

19. The package of claim 2 wherein said means for electrical interconnection comprises an aperture extending through said base component, said cover component and said dielectric sealant means filled with a conductive material selected from the group consisting of silver filled epoxy, silver filled solder glass and low melting solders.

20. The package of claim 19 wherein said conductive material is a silver filled epoxy.

21. The package of claim 3 wherein said means for electrical interconnection comprises an aperture extending through said metal or metal alloy base, metal or metal alloy cover and dielectric sealant means filled with a conductive material selected from the group consisting of silver filled epoxy, silver filled solder glass and low melting solder.

22. The package of claim 21 wherein said conductive material is a silver filled epoxy.

23. The package of claim 21 wherein said aperture further extends through at least one of said pad supports.

24. The package of claim 2 wherein said means for electrical interconnection comprises an aperture extending through said dielectric sealant means filled with a conductive material selected from the group consisting of silver filled epoxy, silver filled solder glass and low melting.

25. The package of claim 24 wherein said conductive material is a silver filled epoxy.

26. The package of claim 3 wherein said means for electrical interconnection comprises an aperture extending through said dielectric sealant means filled with a conductive material selected from the group consisting of silver filled epoxy, silver filled solder glass and low melting solder.

27. The package of claim 26 wherein said conductive material is silver filled epoxy.

28. The package of claim 2 wherein said means for electrical interconnection comprises a conductive strap in electrical contact with both said base component and said cover component.

29. The package of claim 28 wherein said conductive strap is bonded to said base component and to said cover component with an electrically conductive adhesive.

30. The package of claim 3 wherein said means for electrical interconnection comprises a conductive strap in electrical contact with said base component, cover component and pad supports.

31. The package of claim 30 wherein said conductive strap is bonded to said base component, cover component and pad support with a conductive adhesive.

32. A package adapted to receive an electronic device, comprising:
    a base component formed from aluminum or an aluminum alloy;
    a cover component formed from aluminum or an aluminum alloy;
    a leadframe disposed between said base component and said cover component, said leadframe having a plurality of leads about a centrally positioned chip attach pad and pad supports;
    a dielectric adhesive film for bonding said base component to said cover component;
    an anodization layer over at least those portions of said base component and of said cover component which contact said dielectric adhesive film or which form an exterior surface of said package; and
    at least two contact pins extending from said base component and from said cover component, each said contact pin terminating at a tip which is electrically contacted to said pad supports.

33. The package of claim 32 wherein a conductive adhesives bonds the tips of said contact pins to said pad supports.

34. The package of claim 33 wherein said contact pins comprise protrusions having a diameter effective to align said dielectric adhesive film and a length effective to define said package thickness.

35. The package of claim 34 wherein said dielectric adhesive film contains apertures adapted to receive said contact pins, said apertures having a diameter slightly larger than the diameter of said contact pins.

36. The package of claim 35 wherein said protrusions have a length of from about 0.005 inches to about 0.020 inches.

37. The package of claim 34 wherein said base component and said cover component have a protrusion located at each corner.

38. The package of claim 32 including said electronic device bonded to said centrally positioned chip attach pad and electrically interconnected to said plurality leads.

* * * * *